March 31, 1970 G. W. CLARK 3,504,098

PRINTED CIRCUIT PANEL

Original Filed March 1, 1965

INVENTOR.

Geoffrey William Clark

By: Kelman and Berman

AGENTS

United States Patent Office 3,504,098

Patented Mar. 31, 1970

3,504,098

PRINTED CIRCUIT PANEL

Geoffrey William Clark, Bramcote, Beeston, England, assignor, by mesne assignments, to Resources and Facilities Corporation, New York, N.Y.

Original application Mar. 1, 1965, Ser. No. 435,997. Divided and this application Jan. 7, 1969, Ser. No. 789,547

Claims priority, application Great Britain, Feb. 3, 1965, 4,648/65

The portion of the term of the patent subsequent to June 21, 1983, has been disclaimed Int. Cl. H05k *1/02*

U.S. Cl. 174—68.5 4 Claims

ABSTRACT OF THE DISCLOSURE

A printed circuit panel having a panel of insulating material and a conductive circuit which partly covers a portion of one surface of the panel is provided with a flat wafer, stator, contact, or pad which is superimposed on the one panel surface, and whose edge penetrates into the panel material. The flat superimposed element is conductively connected with the circuit by mechanical engagement or by soldering. It is attached to the panel by pressing the edge portions into the panel while the element is superimposed on the panel surface.

This application is a division of my copending application Ser. No. 435,997, filed on Mar. 1, 1965.

The present invention relates to an improved printed circuit panel and is applicable to circuit panels in which the circuit is produced by die stamping, etching or plating methods and in particular concerns combining switch wafers, stators, contacts or pads with the circuit conductors. The present invention also concerns improvements in or modifications of the invention described and claimed in my prior application Ser. No. 318,775, filed on Oct. 21, 1963, now Patent No. 3,257,537.

As explained in my said prior patent it is customary to plate the copper sheet from which the criciut is formed with gold, palladium, rhodium or heavy silver which is a very costly procedure because the said basic sheet has to be plated with a strip-like area of this metal of which possibly only a comparatively insignificant part is utilized as wafers or stators, whereby a wastage of very expensive metal occurs.

According to my said prior invention there is provided a method of producing a printed circuit panel which consists in stamping the circuit of copper or other suitable material, mounting it on an insulating base and then applying to appropriate terminal parts of said circuits bimetal wafers or pads by a subsequent die stamping operation whereby said wafers are affixed over the ends of the terminal parts of the circuit. In this manner wastage of said very expensive metal is eliminated.

According to the present invention there is provided a method of producing a printed circuit panel wherein the conductive circuit produced by die stamping, etching or plating methods is substantially planar and in area contact with an insulating panel. A substantially flat conductive element such as a switch wafer, stator, contact or pad is applied to an appropriate terminal part of the circuit by die stamping the wafer to the exposed surface of the insulating panel around the entire surrounding edge of the wafer and so that the latter overlaps said terminal part or is in close juxtaposition to said part so that it can be soldered thereto.

The wafers, stators, contacts or pads can be made of any subsidiary contact material, that is pure or alloyed metals, particularly precious metals, but not necessarily so, and can be in bimetal form or be of a pure or single metal.

To enable the invention to be clearly understood two embodiments thereof will now be described by way of example with reference to the accompanying drawing, wherein.

Figure 1:
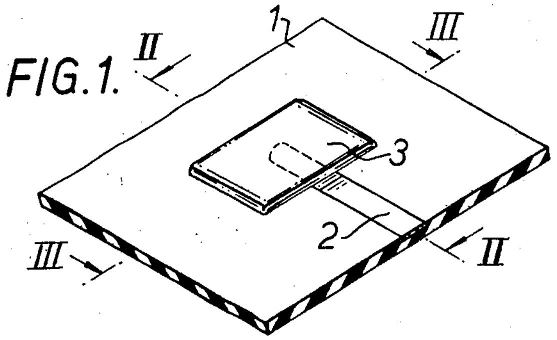
FIG. 1 is a fragmentary perspective view of a wafer applied to a terminal part of a circuit board conductor.
Figure 2:
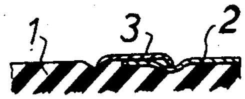
FIG. 2 is a section taken on the line II—II of FIG. 1.
Figure 3:
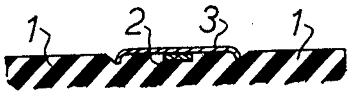
FIG. 3 is a section taken on the line III—III of FIG 1.

Referring firstly to FIGS. 1 to 3 of the drawings, the insulating panel of the circuit is indicated at 1, and a circuit conductor partly covering the panel surface at 2, the circuit being applied to the panel by die stamping, etching or plating methods.

Wafers, stators, contacts or pads 3 are applied to the terminal parts of the appropriate conductors 2 by a die stamping operation so that each wafer is die stamped around its entire edge or periphery so that this edge is impressed into the face of the panel as clearly shown in FIGS. 2 and 3 and overlaps said terminal part of the circuit conductor 2 and is impressed into the latter as clearly shown in FIG. 2 so as to make a good electrical connection therewith and to lock the wafer to the panel and to the circuit.

Figure 4:
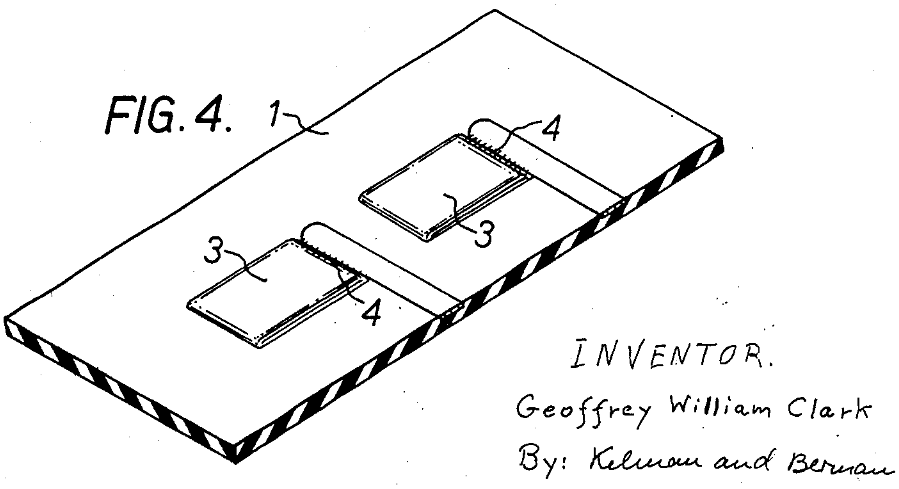
FIG. 4 illustrates a modification in which the wafers or pads are stamped on to a board and in close juxtaposition to terminal parts of circuit conductors and electrically connetced to the latter by soldering.

Referring next to FIG. 4, the method is similar to that described with reference to FIGS. 1 to 3, in that one face of each wafer 3 is superimposed on the surface panel, and the wafer is die stamped around its entire edge or periphery into the surface of the circuit panel, but in this case instead of being made to overlap a terminal part of a circuit conductor, each wafer is located in close juxtaposition thereto and is electrically connected to said part by soldering as indicated at 4.

As previously explained the switch wafers, stators, contacts or pads can be made of any subsidiary contact material, that is pure or alloyed metals, particularly precious metals, but not necessarily so, and can be in bimetal form or be of a pure or single metal.

What is claimed is:

1. A printed circuit panel comprising:

(a) a panel of insulating material;

(b) a conductive circuit partly covering a surface of said panel and leaving a portion of said surface exposed; and (c) a conductive element having two opposite substantially flat faces and an edge portion connecting said flat faces, (1) respective parts of one of said faces being contiguously superimposed on a portion of said circuit and on said exposed surface portion, (2) said edge portion engaging respective recesses in said circuit portion and said surface portion in locking engagement.

2. A printed circuit panel as set forth in claim 1, wherein said edge portion surrounds said faces on all sides.

3. A printed circuit panel comprising:

(a) a panel of insulating material;

(b) a conductive circuit partly covering said surface of said panel and leaving a portion of said surface exposed, said exposed surface portion being contiguously adjacent said circuit;

(c) a conductive element having two opposite substantially flat faces and an edge portion connecting said flat faces, (1) one of said faces being contiguously superimposed on said exposed surface portion, and (2) said edge portion engaging a recess in said surface portion in locking engagement; and (d) a body of solder conductively interposed between said element and said circuit.

4. A printed circuit panel as set forth in claim 3, wherein said edge portion surrounds said faces on all sides.

References Cited

UNITED STATES PATENTS 3,257,537 6/1966 Clark ---------- 174—68.5 XR

DARRELL L. CLAY, Primary Examiner

U.S. Cl. X.R.

29—626; 200—166